United States Patent
Pillonnet et al.

(10) Patent No.: US 11,139,821 B2
(45) Date of Patent: Oct. 5, 2021

(54) ANALOG-TO-DIGITAL CONVERTER FOR A CAPACITIVE ADIABATIC LOGIC CIRCUIT

(71) Applicant: Commissariat à l'Énergie Atomique et aux Énergies Alternatives, Paris (FR)

(72) Inventors: Gaël Pillonnet, Proveysieux (FR); Hervé Fanet, Revel (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 0 days.

(21) Appl. No.: 17/019,089

(22) Filed: Sep. 11, 2020

(65) Prior Publication Data
US 2021/0091779 A1 Mar. 25, 2021

(30) Foreign Application Priority Data
Sep. 20, 2019 (FR) ...................................... 1910403

(51) Int. Cl.
*H03M 1/12* (2006.01)
*H03M 1/18* (2006.01)
(Continued)

(52) U.S. Cl.
CPC ............... *H03M 1/18* (2013.01); *H03M 1/34* (2013.01); *H03M 1/68* (2013.01)

(58) Field of Classification Search
CPC ...... H03M 1/34; H03M 1/1004; H03M 1/145; H03M 1/502; H03M 1/504; H03M 1/54;
(Continued)

(56) References Cited

U.S. PATENT DOCUMENTS 6,438,422 B1 * 8/2002 Schu .................... A61N 1/3605
                                                        607/16
7,183,867 B2 * 2/2007 Matsuura ................. H03B 5/32
                                                        331/117 FE
(Continued)

FOREIGN PATENT DOCUMENTS

EP         3 182 590 A1    6/2017

OTHER PUBLICATIONS

Preliminary Search Report for French Application No. 1910403, dated Jun. 4, 2020.
(Continued)

*Primary Examiner* — Linh V Nguyen
(74) *Attorney, Agent, or Firm* — Wolf, Greenfield & Sacks, P.C.

(57) ABSTRACT

An analog-to-digital converter for an adiabatic logic circuit, including at least one variable-capacitance cell, the cell including first and second main terminals and at least one control terminal insulated from its first and second main terminals and capable of receiving a control voltage to vary the capacitance between its first and second main terminals between a low value and a high value, wherein: the cell has its first main terminal coupled to a node of application of a variable periodic converter power supply voltage; the cell has its second main terminal coupled to a node for supplying a binary output signal of the converter; and the cell receives on its first control terminal an analog input voltage of the converter.

12 Claims, 7 Drawing Sheets

(51) Int. Cl.
  *H03M 1/34* (2006.01)
  *H03M 1/68* (2006.01)

(58) Field of Classification Search
  CPC .... H03M 1/12; H03M 13/6508; H03M 1/466;
    H03M 1/68; H03M 1/18; H03M 13/1575;
    H03M 1/66; H03M 13/00; H03M 13/158;
    H03M 13/27; H03M 13/2957; H03M
    13/6569; H03M 1/0818; H03M 1/0863
  USPC .................................. 341/118–121, 155, 172
  See application file for complete search history.

(56) References Cited

U.S. PATENT DOCUMENTS

| | | | | |
|---|---|---|---|---|
| 9,531,384 | B1* | 12/2016 | Morrison | H03K 19/00315 |
| 10,686,367 | B1* | 6/2020 | Low | H02M 1/36 |
| 2006/0111862 | A1* | 5/2006 | Otterbach | B60R 21/0136 |
| | | | | 702/98 |
| 2017/0179954 | A1* | 6/2017 | Fanet | H03K 19/0019 |
| 2019/0328230 | A1* | 10/2019 | Schumacher | A61B 5/0031 |
| 2019/0393776 | A1* | 12/2019 | Low | H02M 3/07 |
| 2020/0153436 | A1* | 5/2020 | Fanet | H03K 19/0019 |

OTHER PUBLICATIONS

Galisultanov et al., Capacitive-Based Adiabatic Logic. Reversible Computation 2017: Lecture Notes in Computer Science. Jul. 6-7, 2017;10301:52-65. https://doi.org/10.1007/978-3-319-59936-6_4.

Moyal et al., Adiabatic threshold inverter quantizer for a 3-bit flash ADC. 2016 IEEE International Conference on Wireless Communications, Signal Processing and Networking (WiSPNET). Mar. 23, 2016:1543-6.

Pillonnet et al., Adiabatic capacitive logic: a paradigm for low-power logic. 2017 IEEE International Symposium on Circuits and Systems (ISCAS). May 28, 2017:1-4.

Talukdar et al., An improved TIQ comparator based 3-bit flash ADC. 2017 IEEE 1st International Conference on Electronics, Materials Engineering and Nano-Technology (IEMENTech). Apr. 28, 2017:1-4.

FR1910403, Jun. 4, 2020, Preliminary Search Report.

* cited by examiner

ANALOG-TO-DIGITAL CONVERTER FOR A CAPACITIVE ADIABATIC LOGIC CIRCUIT

CROSS REFERENCE TO RELATED APPLICATION

This application claims the priority benefit of French patent application number 19/10403, the content of which is hereby incorporated by reference in its entirety to the maximum extent allowable by law.

TECHNICAL BACKGROUND

The present disclosure concerns the field of adiabatic logic circuits formed from variable-capacitance cells, also called capacitive adiabatic logic circuits. It more particularly aims at an analog-to-digital converter for a capacitive adiabatic logic circuit.

PRIOR ART

The applicant has already provided, particularly in patent applications EP3182590 (B14590-DD16568), EP3416175 (B15834-DD17806), and EP3435546 (B16125-DD17999), as well as in French patent application No 18/56243 (B17049-DD18578) filed on Jul. 6, 2018 and in French patent application No 18/71519 (B17449-DD18916) filed on Nov. 14, 2018, embodiments of adiabatic logic circuits based on variable-capacitance cells.

To be able to interface these circuits with external devices (sensors, processing circuits, etc.) formed in other technologies, it would be desirable to have an analog-to-digital conversion circuit capable of converting an analog input signal into a digital signal compatible with a capacitive adiabatic logic circuit, that is, a series of binary logic states each corresponding to an AC voltage having its amplitude determining the value, high or low, of the logic signal.

SUMMARY

An embodiment provides an analog-to-digital converter for an adiabatic logic circuit, comprising at least one variable-capacitance cell, said at least one cell comprising first and second main terminals and at least one control terminal insulated from its first and second main terminals and capable of receiving a control voltage to vary the capacitance between its first and second main terminals between a low value and a high value, wherein:
said at least one cell has its first main terminal coupled to a node of application of a variable periodic converter power supply voltage;
said at least one cell has its second main terminal coupled to a node for supplying a binary output signal of the converter; and
said at least one cell receives on its first control terminal a voltage representative of an analog input voltage of the converter.

According to an embodiment, said at least one cell comprises a plurality of cells having respectively different threshold voltages for the switching between the low value and the high value of the capacitance between their first and second main terminals, the second main terminals of said cells being respectively coupled to different nodes for supplying binary converter output signals.

According to an embodiment, each cell receives on its control terminal a voltage equal to the analog input voltage of the converter.

According to an embodiment, each cell has a transfer function between the control voltage applied to its control terminal and the capacitance between its first and second main terminals having a single rising edge defining a cell switching threshold voltage.

According to an embodiment, each cell comprises a variable-capacitance capacitor comprising four electromagnetic control electrodes, the capacitors of the different cells having different structures defining the different switching threshold voltages.

According to an embodiment, each cell comprises at least one fixed-capacitance capacitor and one variable-resistance element, the variable-resistance elements of the different cells having different threshold voltages for the switching between a high resistance value and a low resistance value.

According to an embodiment, each variable-resistance element comprises a transistor having a front gate coupled to the control terminal of the cell via a voltage dividing bridge, the voltage dividing bridges of the variable-resistance elements of different cells having different division ratios.

According to an embodiment, each variable-resistance element comprises a dual-gate transistor comprising a front gate coupled to the control terminal of the cell and a back gate, the back gates of the transistors of the variable-resistance elements of different cells being coupled to terminals of application of different bias voltages.

According to an embodiment, at least one cell among said plurality of cells has a transfer function between the control voltage applied to its control terminal and the capacitance between its first and second main terminals exhibiting at least one rising edge and one falling edge respectively defining two different cell switching threshold voltages.

According to an embodiment, each cell comprises a variable-capacitance capacitor comprising four electromagnetic control electrodes, the capacitors of the different cells having different structures defining the different switching threshold voltages.

According to an embodiment, said at least one variable-capacitance cell comprises a single variable-capacitance cell, the converter further comprising a variable-gain circuit coupling the control terminal of said cell to a terminal of application of the analog input voltage of the converter.

According to an embodiment, the variable-gain circuit comprises a resistive voltage dividing bridge having a variable division ratio.

According to an embodiment, the variable-gain circuit comprises a variable-capacitance capacitive charge pump.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
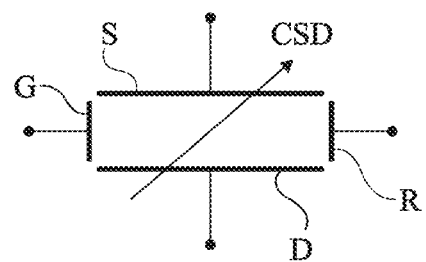
FIG. 1 schematically illustrates an example of a variable-capacitance cell.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the capacitive adiabatic logic circuits capable of being coupled at the output of the described analog-to-digital converters has not been detailed, the forming of such circuits being within the abilities of those skilled in the art, particularly on reading of the above-mentioned patent applications previously filed by the applicant.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

Unless specified otherwise, the expressions "around", "approximately", "substantially" and "in the order of" signify within 10%, and preferably within 5% or, when relating to angle values or to orientations, within 10°, preferably within 5°.

In a capacitive adiabatic logic circuit, the logic input and output signals of a logic cell correspond to AC voltages having an amplitude capable of taking a plurality of discrete values, determining the value of the logic signal. It is also spoken of pulse logic or dynamic logic since the states of the logic signals are only available during a fraction of the period of a clock signal formed by the power supply voltage of the cell. Unless specified otherwise, the expression logic signal here means a binary logic signals, that is, a signal that can only take two states, a high state (logic 1), for example corresponding to a voltage amplitude close to the amplitude of the cell power supply voltage, for example, in the range from 1 to 40 volts, for example, in the range from 5 to 30 volts, or a low state (logic 0), for example corresponding to a voltage amplitude close to 0 V, for example, smaller than 0.5 volt.

It is here desired to form an analog-to-digital converter capable of converting an analog input voltage into a digital signal compatible with a capacitive adiabatic logic circuit, that is, into a series of binary logic signals of the type defined hereabove, forming a binary code representative of the analog input voltage.

FIG. 1 schematically illustrates an example of a variable-capacitance cell of the type described in the above-mentioned patent applications, capable of being used in a capacitive adiabatic logic circuit. The cell of FIG. 1 comprises a two main electrodes S and D separated by a dielectric region (for example by a stack of a dielectric region and of a resistive region), and two control electrodes G and R electrically insulated from each other and electrically insulated from main electrodes S and D, capable of receiving a control signal to vary capacitance CSD between main electrodes S and D. The above-mentioned patent applications describe embodiments of such cells in the form of variable-capacitance capacitors comprising four electromechanically-controlled electrodes, that is, where main electrodes S and D are mobile with respect to each other, and the control signal applied between electrodes R and G enables to vary the relative position of electrodes S and D so as to vary capacitance CSD. The above-mentioned French patent application No 18/71519 (B17449-DD18916) further describes embodiments of such cells based on fixed-capacitance capacitors and on variable-resistance elements. In this case, the cell may, as a variant, comprise a single control electrode G, electrode R being for example confounded with main electrode S or D. The cell of FIG. 1 is a cell having a positive capacitance variation, that is, the capacitance CSD between its main electrodes S and D is an increasing function of the signal applied between its control electrodes G and R. The above-mentioned patent applications also describe variable-capacitance cells with a negative capacitance variation, that is, where the capacitance CSD between main electrodes S and D of the capacitor is a decreasing function of the signal applied between its control electrodes G and R. Replacing variable-capacitance cells having a positive capacitance variation with variable-capacitance cells having a negative capacitance variation for example enables to generate complementary logic signals.

Figure 2:
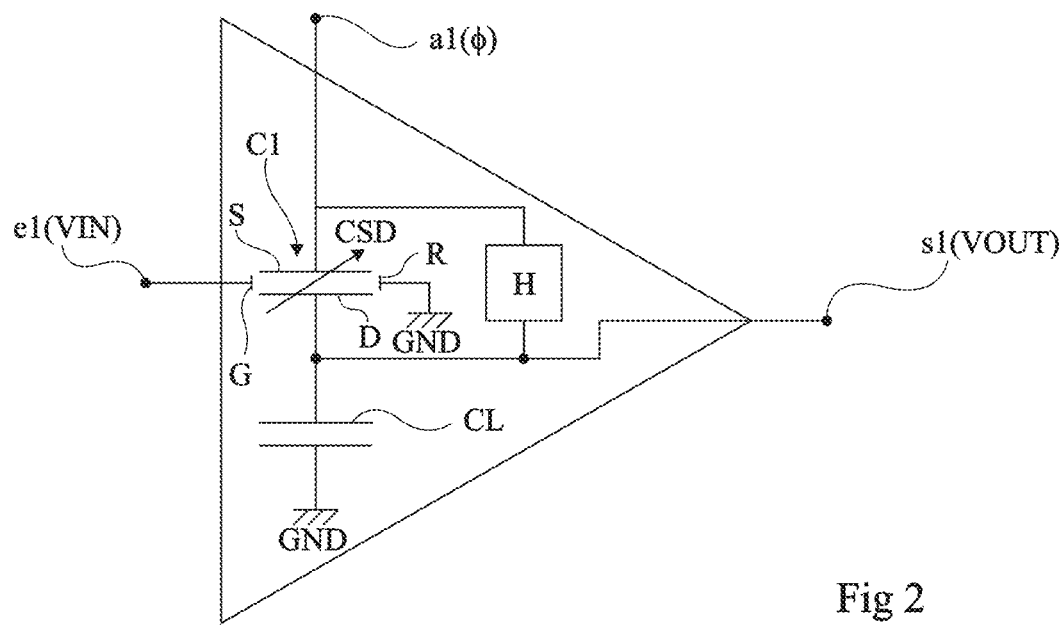
FIG. 2 is an electric diagram of an example of buffer cell in capacitive adiabatic logic.

FIG. 2 is an electric diagram of an example of capacitive adiabatic logic buffer cell. The buffer cell of FIG. 2 comprises a variable-capacitance cell C1 having a positive capacitance variation, for example, of the type described in relation with FIG. 1. The main electrode S of cell C1 is coupled, for example, connected, to a terminal a1 of application of a power supply voltage □ of the buffer cell, referenced to a node GND of application of a reference potential of the buffer cell, for example, connected to ground. The main electrode D of cell C1 is coupled, for example connected, to a floating node for supplying an output voltage VOUT of the buffer cell, referenced to node GND. The control electrode G of cell C1 is coupled, for example connected, to a terminal e1 of application of a logic input voltage VIN of the buffer cell, referenced to ground GND. The control electrode R of cell C1 is coupled, for example, connected, to node GND. FIG. 2 shows a capacitor CL connected between the output node s1 of the cell and reference node GND, schematically representing the output capacitance of the buffer cell. In practice, output capacitance CL, rather than comprising a component specifically formed and connected to output node s1, may correspond to the sum of the capacitances of the different elements coupled to node s1, particularly interconnection tracks, or also another capacitive logic cell (not shown) having an input that may be connected to node s1.

In the example of FIG. 2, the buffer cell further comprises a hold circuit H capable of holding output voltage VOUT of the cell in a high level during phases of transition of input voltage VIN from a high level to a low level.

Figure 3:
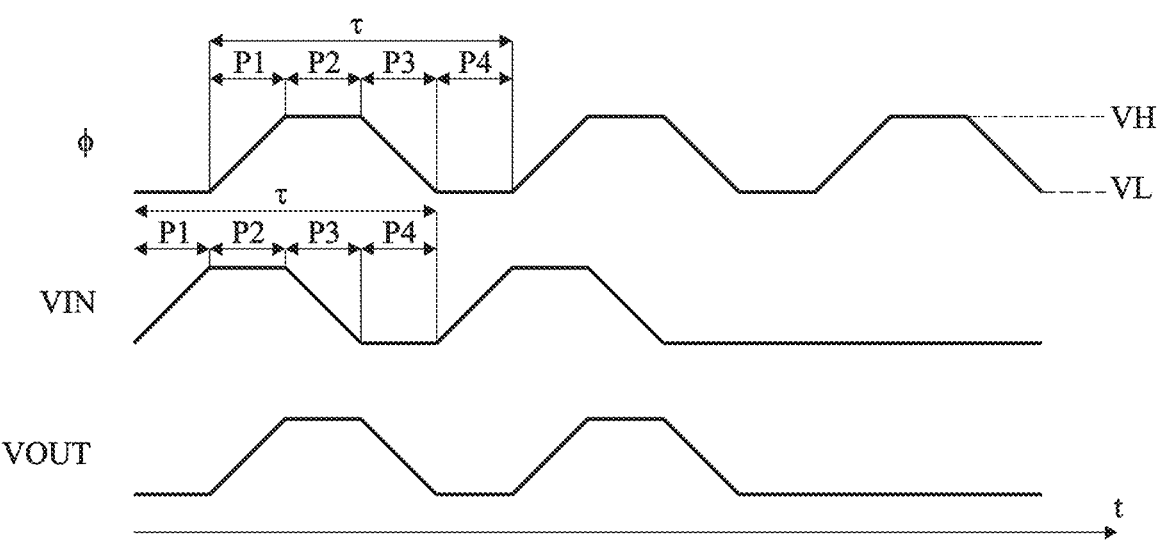
FIG. 3 is a timing diagram illustrating the operation of the buffer cell of FIG. 2.

FIG. 3 is a diagram illustrating the operation of the buffer cell of FIG. 2. More particularly, FIG. 3 illustrates the variation according to time t (in abscissas) of power supply voltage Φ, of the input voltage VIN, and of the output voltage VOUT of the buffer cell of FIG. 2.

Power supply voltage Φ is a periodic AC voltage, delivered by a variable voltage source, not shown in FIG. 2. Voltage Φ varies periodically and continuously between a low value VL, for example, in the range from 0 to 2 volts, and a high value VH, for example, in the range from 5 to 10 volts. In the shown example, power supply voltage Φ is a trapezoidal voltage. More particularly, in the present example, each period τ of voltage Φ comprises four successive phases P1, P2, P3, and P4 substantially of same duration T=τ/4. During phase P1, voltage Φ increases linearly from its low value VL to its high value VH. During phase P2, voltage Φ remains substantially constant and equal to its high value VH. During phase P3, voltage Φ decreases linearly from its high value VH to its low value VL. During phase P4, voltage Φ remains substantially constant and equal to its low value VL.

Voltages VIN and VOUT are synchronized on power supply voltage Φ, which is also used as a clock signal. Voltages VIN and VOUT are AC voltage having a shape variation similar to that of variable power supply voltage Φ. Voltages VIN and VOUT respectively define logic signals IN and OUT. Logic signal IN, respectively OUT, is in a high state when the amplitude of voltage VIN, respectively VOUT, is at a high level, for example, close to the amplitude of power supply voltage Φ, and is at a low level when the amplitude of voltage VIN, respectively VOUT, is at a low level, for example, close to 0 volt. Voltage VIN has a phase lead in the order of T=τ/4 on power supply voltage Φ. Voltage VOUT is in phase with power supply voltage Φ.

In the example shown in FIG. 3, input signal IN is in the high state for two successive periods τ of power supply signal Φ and the in the low state for a third period of power supply signal Φ.

Output voltage VOUT depends on the ratio of the variable capacitance CSD of capacitive cell C1 controlled by input voltage VIN to fixed capacitance CL. For a logic 0 of input signal IN (voltage VIN having an amplitude close to 0 volt), the capacitance CSD of capacitive cell C1 remains at a low value CSDL, and the voltage pulse VOUT transmitted on output terminal s1 of the buffer cell is at a low amplitude level, for example, close to 0 volt. For a logic 1 of input signal IN (voltage VIN having an amplitude close to the amplitude of power supply voltage Φ), the capacitance CSD of capacitive cell C1 increases up to a high value CSDH, and a voltage pulse VOUT having a high amplitude level, for example, close to the amplitude of power supply voltage 4), is obtained on output s1 of the buffer cell. The hold circuit H internal to the buffer cell enables to hold between the power supply and output terminals a1 and s1 of the buffer cell, during the phase of decrease of the high-level pulse of the input voltage VIN of the cell (phase P3 of voltage VIN, corresponding to phase P2 of voltage Φ), a capacitance substantially equal to the high capacitance value CSDH of capacitive cell C1, which enables to provide at the cell output a high-level pulse having the same shape (trapezoidal in the present example) as power supply voltage Φ.

As described in the above-mentioned patent applications, hold circuit H may comprise a variable-capacitance electromagnetic control capacitor comprising four electrodes, or a fixed-capacitance capacitor and a variable-resistance element. As a variant, hold circuit H may be omitted when a physical phenomenon inherent to the structure of capacitance cell C1, for example, an electrostatic pull-back force, enables to hold the capacitance CSD of cell C1 at its high value CSDH during phase P3 of decrease of voltage VIN.

In practice, trapezoidal power supply voltage Φ may be approximated by a sinusoidal voltage of period τ, or by any other shape allowing a progressivity of the voltage build up (continuous variation shape).

It should be noted that the buffer cell described in relation with FIGS. 2 and 3 is a non-inverting buffer cell, that is, it copies on its output terminal s1 a signal OUT having the same logic state as the signal IN applied to its input terminal e1. Similarly, an inverting buffer cell in capacitive adiabatic logic may be formed by simply replacing, in the example of FIG. 2, the capacitive cell having a positive capacitance variation C1 with a capacitive cell having a negative capacitance variation.

More generally, various basic logic functions, and in particularly the AND, OR, NON, NAND functions may be formed in capacitive adiabatic logic by means of one of a plurality of variable-capacitance capacitive cells, having a positive capacitance variation and/or having a negative capacitance variation.

It should be noted that in a capacitive adiabatic logic circuit using a periodic variable power supply voltage with four phases, such as described hereabove, to be able to cascade a large number of elementary logic cells, four similar periodic power supply voltages Φ1, Φ2, Φ3, and Φ4, that is, of same frequency, of same shape, and of same amplitude level, for example, trapezoidal voltages identical or similar to the voltage Φ of FIG. 3, but phase-shifted two by two by approximately π/2 radians, should in practice be provided. As an example, voltage Φ2 is phase-lagged by approximately π/2 radians with respect to voltage Φ1, voltage Φ3 is phase-lagged by approximately π/2 radians with respect to voltage Φ2, and voltage Φ4 is phase-lagged by approximately π/2 radians with respect to voltage Φ3. Thus, at the output of each elementary logic cell receiving a power supply voltage Φj, j being an integer in the range from 1 to 4, an elementary logic cell receiving power supply voltage Φj+1 mod 4 will be connected (that is, the power supply voltage of rank j+1 modulo 4).

Figure 4:
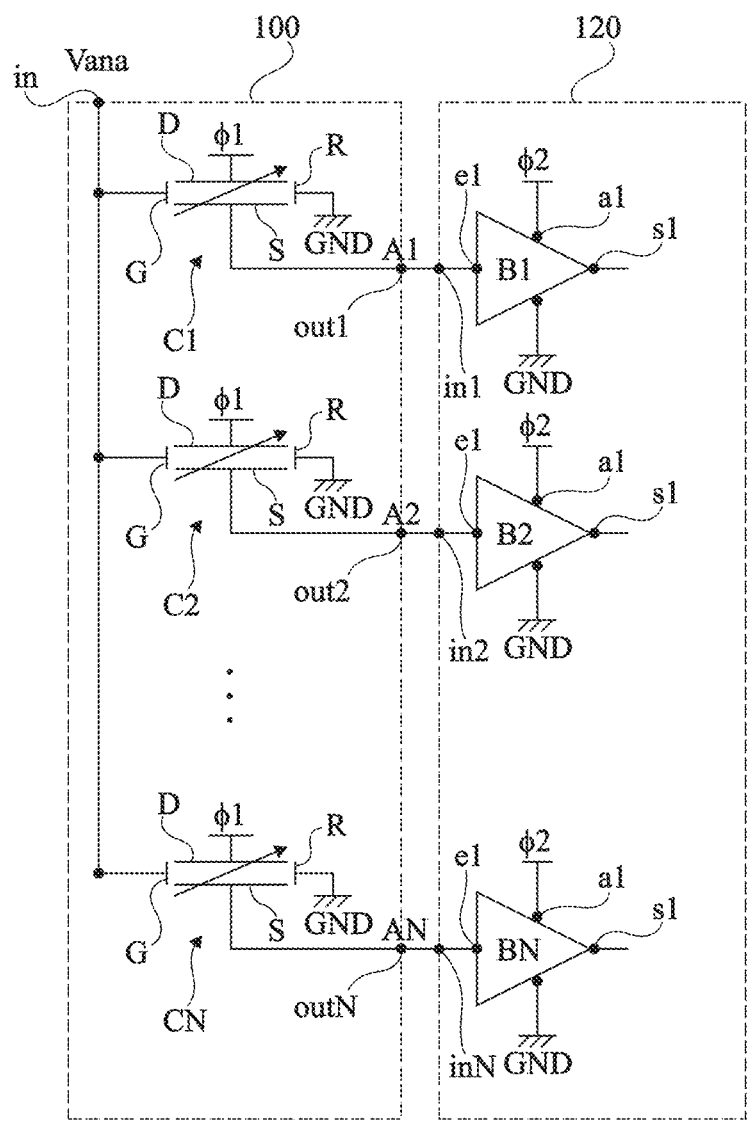
FIG. 4 schematically shows an example of an analog-to-digital converter according to an embodiment.

FIG. 4 schematically shows an example of an analog-to-digital converter 100 according to an embodiment. A converter capable of converting an analog input voltage Vana applied to an input terminal in of the converter into N binary logic signals A1, . . . AN of the above-described type, forming a digital code of N bits representative of input voltage Vana, N being an integer greater than or equal to 2, for example, greater than or equal to 3, is considered herein. The converter of FIG. 4 has a so-called parallel architecture, that is, the N binary signals A1, . . . AN are supplied in parallel (simultaneously) on respectively N output terminals out1, . . . outN of the converter.

The converter 100 of FIG. 4 comprises N variable-capacitance cells C1, . . . CN of the type described in relation with FIG. 1. In the shown example, cells C1, . . . CN are cells having a positive capacitance variation.

Each cell Ci, i being an integer in the range from 1 to N, has its control electrode G coupled, for example, connected, to the input terminal in of the converter.

Each cell Ci further has its electrode D coupled, for example, connected, to a node of application of a variable periodic converter power supply voltage 41, for example, a trapezoidal voltage of the above-described type.

Each cell Ci further has its electrode R coupled, for example, connected, to a node GND of application of reference potential of the converter, for example, connected to ground.

Cells C1, . . . CN have their respective electrodes S coupled, for example connected, respectively to the output terminals out1, . . . outN of the converter.

In addition to converter 100, FIG. 4 also partially and schematically shows a capacitive adiabatic logic circuit 120 comprising N input terminals in1, . . . inN coupled, for example, connected, respectively to the N output terminals out1, . . . outN of converter 100. Each input terminal ini of logic circuit 120 for example corresponds to an input terminal of an elementary logic cell of the circuit. In the shown example, circuit 120 comprises N buffer cells B1, . . . BN, for example, of the type described in relation with FIG. 2, each cell Bi having its input terminal e1 connected to the input terminal ini of same index i of circuit 120. Each buffer cell Bi receives on its power supply node a1 a variable periodic voltage 42, for example, a voltage identical or similar to voltage Φ1 but phase-lagged by π/2 radians with respect to voltage Φ1. Circuit 120 may comprise other capacitive adiabatic logic cells, not detailed, cascaded at the output of cells B1, . . . BN. The outputs of cells B1, . . . BN may be connected to a same logic block (not shown) enabling to combine the N output bits to generate any other type of binary coding, for example, enabling to pass from a thermometric binary coding to a natural binary coding.

The capacitance CSD of each cell Ci of converter 100 may vary between a low value CSDL and a high value CSDH according to the voltage applied between its electrodes G and R, that is, according to the input voltage Vana of the converter. Input voltage Vana is for example referenced to node GND.

According to an aspect of the embodiment of FIG. 4, cells C1, . . . CN of the converter respectively have different switching threshold voltages between the low value CSDL and the high value CSDH of their capacitance CSD.

Figure 5:
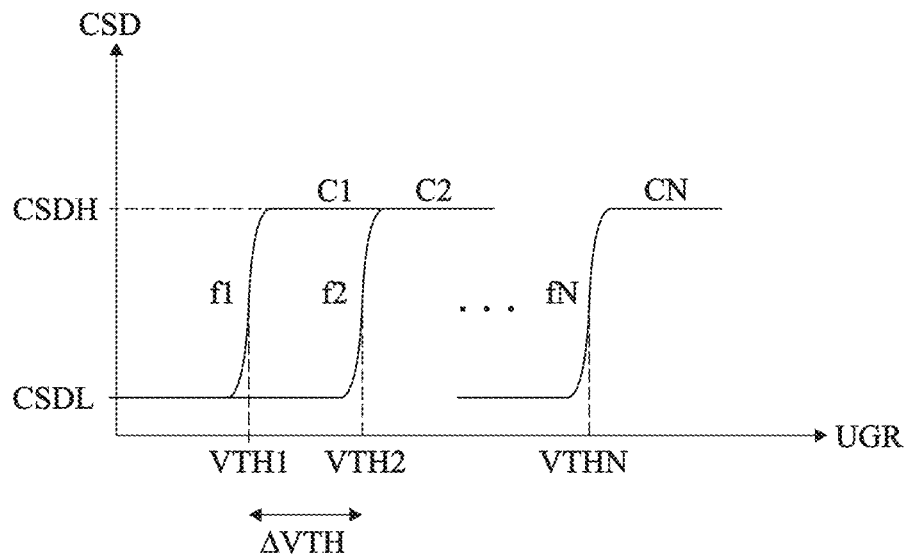
FIG. 5 is a diagram illustrating a first example of operation of the analog-to-digital converter of FIG. 4.

FIG. 5 is a diagram illustrating an example of operation of capacitive cells C1, . . . CN of the analog-to-digital converter of FIG. 4.

FIG. 5 shows, for each of capacitive cells C1, . . . CN of the converter, the variation of the capacitance CSD of the cell according to the voltage UGR applied between its control electrodes G and R. As shown in FIG. 5, the transfer functions f1, . . . fn of the different cells with, for each cell, CSD=fi(UGR), have similar shapes. More particularly, for each cell Ci, there exists a voltage threshold VTHi such that, when voltage UGR of the cell crosses this threshold, the cell capacitance CSD abruptly switches from its low value CSDL to its high value CSDH, or from its high value CSDH to its low value CSDL. In this example, cells C1, . . . CN all have substantially the same low value CSDL and the same high capacitance value CSDH. As shown in FIG. 5, cells C1, . . . CN all have different threshold values. More particularly, in the shown example, threshold voltages VTH1, . . . VTHN are increasing according to the rank of the considered index i. In other words, for each cell Ci except for cell C1, the threshold voltage VTHi of the cell is greater than the threshold voltage VTHi−1 of cell Ci−1. In the example of FIG. 5, the interval between the threshold voltages of two consecutive cells is substantially constant. In other words, for each cell Ci except for cell C1, interval VTHi-VTHi−1 is substantially equal to a same value ΔVTH.

Figure 6:
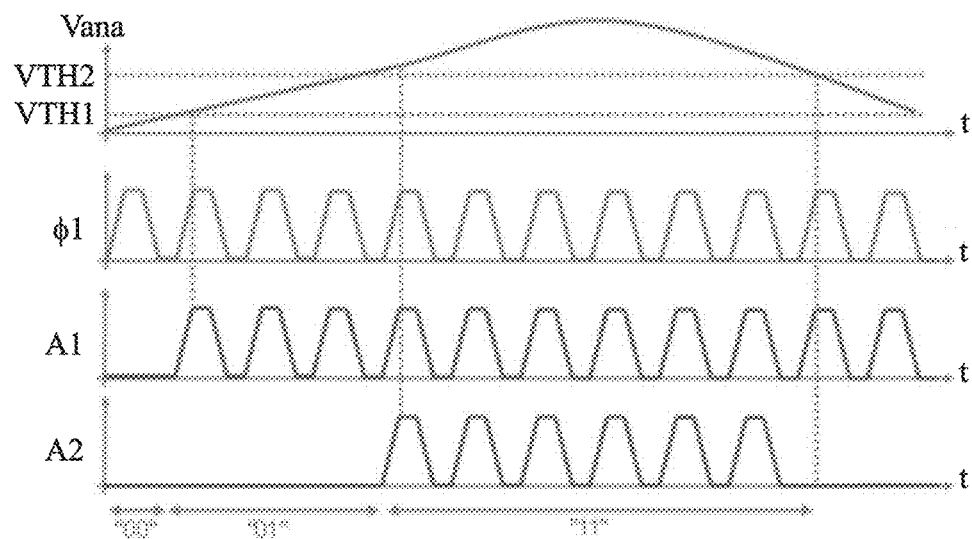
FIG. 6 is another diagram illustrating the first example of operation of the analog-to-digital converter of FIG. 4.

FIG. 6 is a diagram illustrating the operation of the converter of FIG. 4.

An analog-to-digital converter with N=2 output bits is considered in the present example. FIG. 6 more particularly shows the variation, over time t (in abscissas), of the analog input voltage Vana of the converter, of the power supply voltage Φ1 of the converter, and of the binary logic output signals A1 and A2 of the converter (in volts, in ordinates).

The output voltage Ai on each output terminal outi of the converter depends on the ratio of the variable capacitance CSD of cell Ci, controlled by input voltage Vana, to an output stray capacitance (not detailed in FIG. 4) formed between the output terminal outi of the converter and node GND, which may be considered as a fixed capacitance, for example corresponding to the equivalent capacitance of logic cell Bi.

When analog input voltage Vana is smaller than the switching threshold VTH1 of cell C1, the capacitances CSD of cells C1 and C2 are both at their low value CSDL, so that voltage pulses A1 and A2 transmitted on the output terminals out1 and out2 of the converter are both at a low amplitude level, for example, close to 0 volt, corresponding to logic 0s of the input signals of circuit 120. When analog input voltage Vana crosses threshold VTH1, the capacitance CSD of cell C1 switches to its high value CSDH, while the capacitance CSD of cell C2 remains at its low value CSDL. The voltage pulses A1 and A2 transmitted on output terminals out1 and out2 of the converter are thus respectively in a high state, for example, close to the amplitude of power supply voltage 41, and at a low amplitude level, for example, close to 0 volt, respectively corresponding to a logic 1 and to a logic 0 of the input signals of circuit 120. When analog input voltage Vana crosses threshold VTH2, the capacitance CSD of cell C2 switches to its high value CSDH, while the capacitance CSD of cell C1 remains at its high value CSDH. The voltage pulses A1 and A2 transmitted on output terminals out1 and out2 of the converter are then both at a high level, corresponding to logic is of the input signals of circuit 120.

The converter 100 of FIG. 4 thus enables to perform a thermometric binary coding of analog input signal Vana. In practice, other types of binary codings may be generated by adapting the transfer functions f1, . . . fN of capacitive cells C1, . . . CN.

The converter output nodes out1, . . . outN may be regularly reset to a zero voltage, to set the static biasing of the binary logic output signals A1, . . . AN. For this purpose, each output node outi of converter 100 may be coupled to node GND via a reset switch, not shown. As a variant, each output node outi of converter 100 may be coupled to node GND directly by a fixed resistor, preferably a resistor of high value providing a discharge time constant which is much longer, for example, at least 10 times longer, than the period of the periodic power supply signal.

Figure 7:
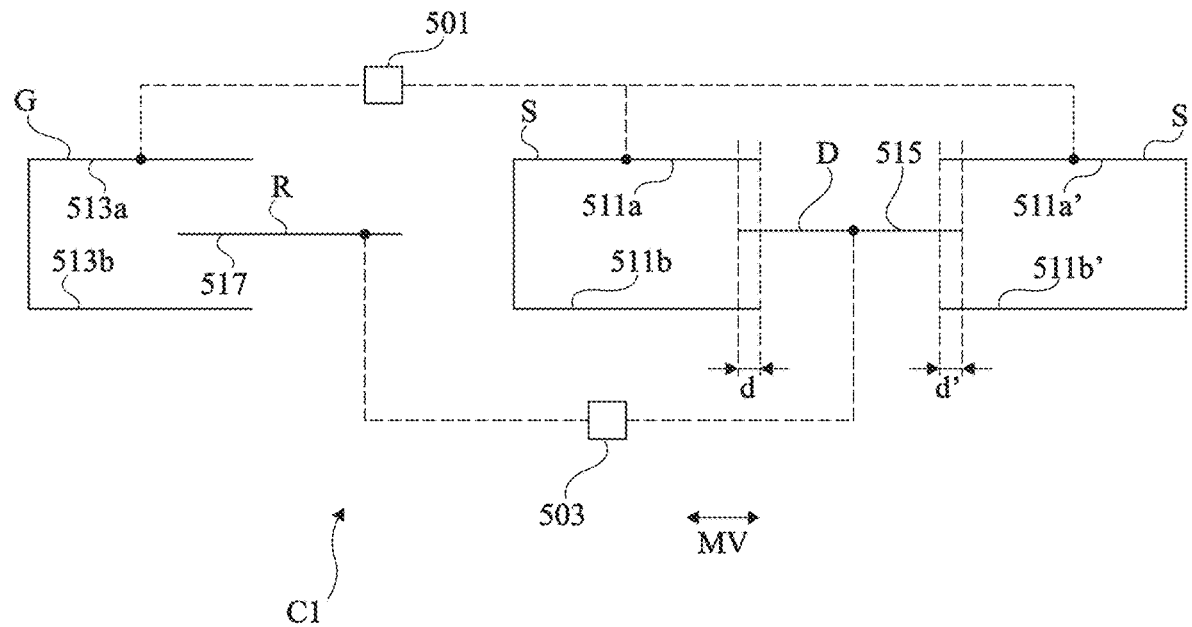
FIG. 7 is a simplified cross-section view of an embodiment of a first variable-capacitance cell of the analog-to-digital converter of FIG. 4.
Figure 8:
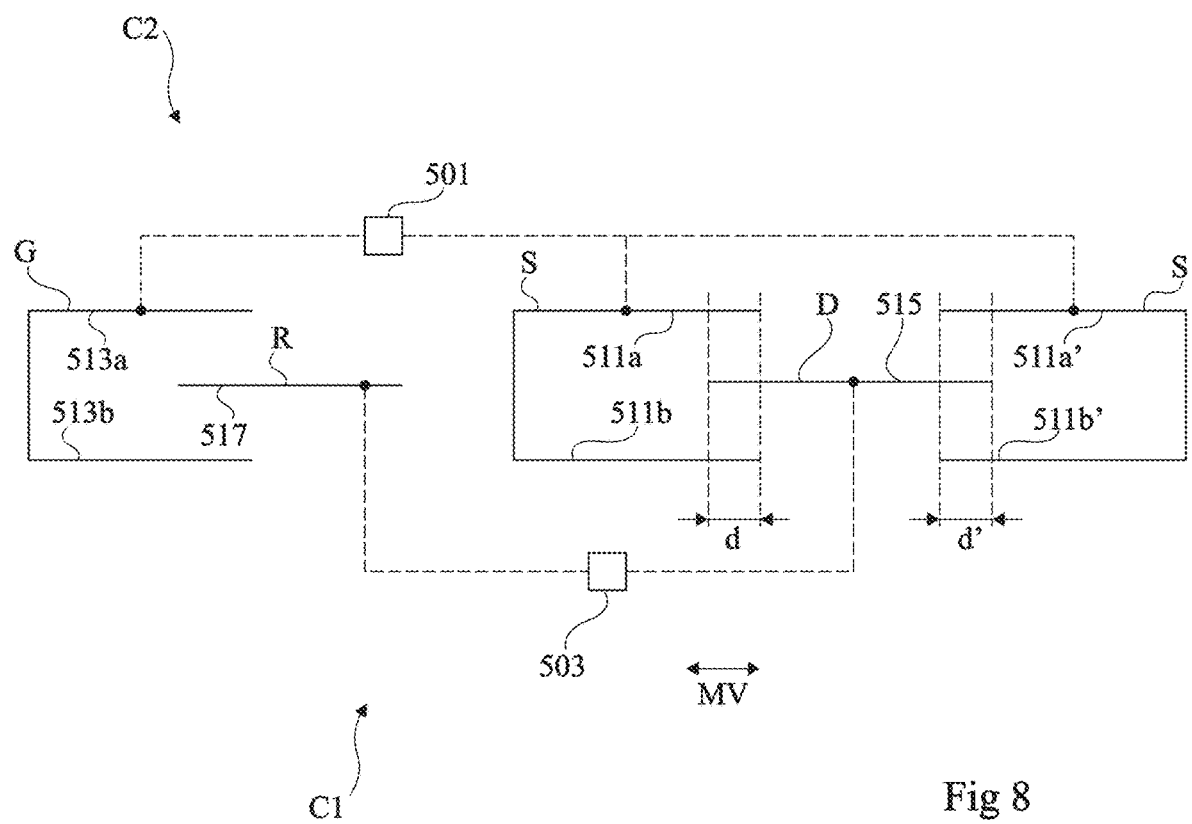
FIG. 8 is a simplified cross-section view of an embodiment of a second variable-capacitance cell of the analog-to-digital converter of FIG. 4.

FIGS. 7 and 8 are simplified cross-section views of an embodiment of the variable-capacitance cells C1 and C2 of an analog-to-digital converter of the type described in relation with FIGS. 4, 5, and 6. More particularly, FIG. 7 shows an embodiment of cell C1 and FIG. 8 shows an embodiment of cell C2. Although only two cells have been shown herein, it will be within the abilities of those skilled in the art to adapt the described teachings to form a larger number N of cells Ci having different switching thresholds VTHi.

The cells C1 and C2 of FIGS. 7 and 8 are each formed of a variable-capacitance capacitor comprising four electromechanically-controlled electrodes.

The capacitor C1 of FIG. 7 comprises two assemblies mobile with respect to each other, respectively called fixed assembly and mobile assembly hereafter. All the elements of the fixed assembly are fixed with respect to one another, and all the elements of the mobile assembly are fixed with respect to one another.

In the example of FIG. 7, electrodes S and G form part of the fixed assembly, and electrodes D and R form part of the mobile assembly. In FIG. 7, the mechanical connections (rigid) between the different elements of the fixed assembly on the one hand, and between the different elements of the mobile assembly on the other hand, have been schematically shown by dashed lines. The square bearing reference 501 in FIG. 7 schematically shows an electric insulation element of the fixed assembly, electrically insulating electrode S from electrode G, and the square bearing reference 503 in FIG. 7 schematically shows an electric insulation element of the fixed assembly, electrically insulating electrode D from electrode R. In practice, certain mechanical connections between electrodes may be contactless connections, for example by means of an electrostatic force, which also enables to ensure the function of electric insulation between the electrodes.

Electrode S comprises two substantially horizontal conductive plates 511a and 511b facing each other (that is, substantially confounded in vertical projection), electrically connected to each other. In the present disclosure, conductive plate designates a plate of a material capable of conducting electric charges, where this material may be a conductive material, for example, a metal, or also a semiconductor material, for example, silicon. Electrode S further comprises two additional substantially horizontal conductive plates 511a' and 511b' facing each other, fixed with respect to conductive plates 511a and 511b, and electrically connected to conductive plates 511a and 511b. Electrode G comprises two substantially horizontal conductive plates 513a and 513b facing each other, electrically connected to each other. Electrode D comprises a substantially horizontal conductive plate 515. Electrode R comprises a conductive plate 517.

In this example, the conductive plates 511a and 511a' of electrode S are substantially coplanar (that is, the median plane between the upper surface and the lower surface of conductive plate 511a and the median plane between the upper surface and the lower surface of conductive plate 511a' are confounded), and the conductive plats 511b and 511b' of electrode S are substantially coplanar. The fixed assembly and the mobile assembly are arranged so that conductive plates 515 and 517 of the mobile assembly are respectively arranged:

in a horizontal plane located between the horizontal plane of conductive plates 511a and 511a' and the horizontal plane of conductive plates 511b and 511b', for example at an equal distance from the plane of conductive plates 511a and 511a' and from the plane of conductive plates 511b and 511b'; and in a horizontal plane located between the horizontal plane of conductive plate 513a and the horizontal plane of conductive plate 513b, for example at an equal distance from the plane of conductive plate 513a and from the plane of conductive plates 513b.

In the example of FIG. 7, conductive plate 517 is arranged at least partially opposite conductive plates 513a and 513b.

There exists an operating position of the capacitor (the position shown in FIG. 7) for example corresponding to an idle position (position in the absence of any electric biasing of the capacitor), where conductive plate 515 is partially opposite conductive plates 511a and 511b and partially opposite conductive plates 511a' and 511b', with, in vertical projection, an overlap distance d between conductive plate 515 and conductive plates 511a and 511b equal to an overlap distance d' between conductive plate 515 and conductive plates 511a' and 511b'.

In this example, the mobile assembly is free to displace according to a single degree of liberty in horizontal translation (parallel to conductive plates 511a, 511b, 511a', 511b', 513a, 513b, 515, 517) with respect to the fixed assembly, to modify the surface area of mobile conductive plate 517 opposite plates 513a and 513b and the surface area of conductive plate 515 opposite plates 511a and 511b and/or 511a' and 511b'. This motion is represented by a double arrow MV in FIG. 7. More particularly, in the example of FIG. 7, the fixed assembly and the mobile assembly are arranged so that when the surface area of conductive plate 517 opposite conductive plates 513a and 513b increases, the surface area of conductive plate 515 opposite conductive plates 511a and 511b increases, and the surface area of conductive plate 515 opposite conductive plates 511a' and 511b' decreases (to become zero when overlap distance d' becomes zero or negative).

The capacitor C1 of FIG. 7 may further comprise pull-back means (not shown in FIG. 5), for example, a pull-back spring, arranged to, in the absence of any electric biasing of electrodes S, D, G, and R, take the mobile assembly back to a so-called idle position (relative to the fixed assembly), for example, the position shown in FIG. 7.

At the first order, the capacitance CSD of capacitor C1 between its main electrodes S and D is proportional to the surface area of conductive plate 515 opposite conductive plates 511a and 511b or opposite conductive plates 511a' and 511b'.

When capacitor C1 is in its idle position such as shown in FIG. 7, the capacitance CSD between the main electrodes S and D of the capacitor is at a low value CSDL. If a low level voltage is applied between the capacitor control electrodes G and R, the capacitor remains in its idle position and capacitance CSD remains at its low value CSDL, and this, whatever the value of the voltage applied between its electrodes S and D. Indeed, due to the fact that overlap distances d and d' are substantially identical, the application of a non-zero voltage between electrodes S and D causes no significant motion of the mobile assembly with respect to the fixed assembly.

When the voltage applied between control electrodes G and R of the capacitor increases, mobile conductive plate 517 is attracted between fixed conductive plates 513a and 513b by electrostatic interaction. This causes a horizontal displacement of the mobile assembly relative to the fixed assembly, tending to increase the surface area of mobile conductive plate 517 opposite conductive plates 513a and 153b, and accordingly to increase the overlap distance d between conductive plate 515 and conductive plates 511a and 511b, and to decrease the overlap distance d' between conductive plate 515 and conductive plates 511a' and 511b'. As long as overlap distance d' is positive, the variation of capacitance CSD is negligible. When overlap distance d' becomes zero, the balance of the electrostatic pull-back forces linked to the symmetry of the output electrodes is broken, so that the mobile assembly abruptly swings to the left, significantly increasing the surface area of conductive plate 515 opposite conductive plates 511a and 511b. Capacitance CSD then switches from its low value CSDL to its high value CSDH.

The overlap length d=d' in idle position determines the switching threshold VTH1 of the cell. The greater the overlap length, or penetration length, the higher threshold VTH1 (that is, the voltage to be applied between electrodes G and R to break the symmetry of the output electrodes).

The capacitor C2 of FIG. 8 comprises the same elements as the capacitor C1 of FIG. 7, arranged substantially in the same way. The capacitor C2 of FIG. 8 differs from the capacitor C1 of FIG. 7 mainly in that, in the capacitor C2 of FIG. 8, the overlap length d=d', in idle position, between conductive plate 515 and conductive plates 511a and 511b on the one hand, and between conductive plate 515 and conductive plates 511a' and 511b' on the other hand, is greater than that of the capacitor C1 of FIG. 7. As a result, the switching threshold voltage VTH2 of capacitor C2 is greater than the switching threshold voltage VTH1 of capacitor C1.

As a variant, in idle position, distance d=d' may be a negative distance, or non-overlap distance. When the voltage applied between control electrodes G and R of the capacitor increases, mobile conductive plate 515 tends to come closer to conductive plates 511a and 511b. The balance of the electrostatic pull-back forces is broken when conductive plate 515 starts penetrating between conductive plates 511a and 511b. The mobile assembly then abruptly swings to the left, resulting in the tilting of conductive plate 515 opposite conductive plates 511a and 511b. Capacitance CSD then switches from its low value CSDL to its high value CSDH. The non-overlap distance d=d' in idle position determines the switching threshold of the cell.

More generally, it will be within the abilities of those skilled in the art to provide other layouts of variable-capacitance capacitors with four electromechanically-controlled electrodes enabling to obtain the transfer functions f1, . . . fn illustrated in FIG. 5, for example, by adapting structures of variable-capacitance capacitors with four electromechanically-controlled electrodes described in the above-mentioned patent applications.

Figure 9:
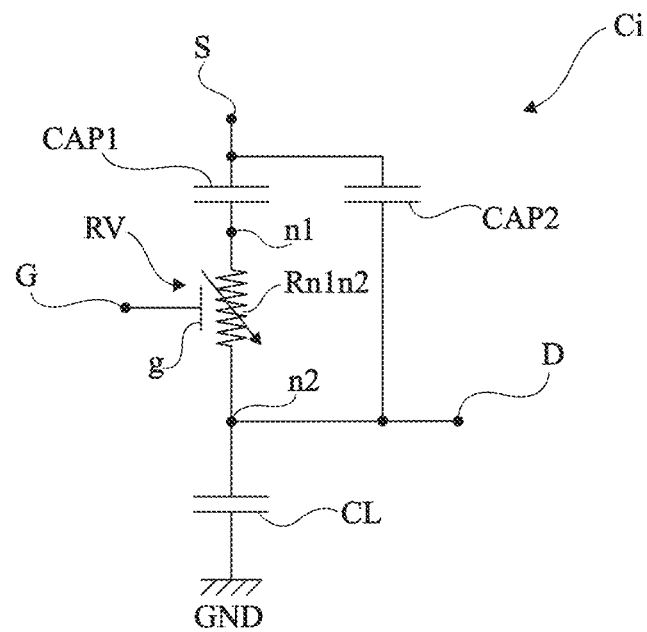
FIG. 9 is an electric diagram of another embodiment of a variable-capacitance cell of the analog-to-digital converter of FIG. 4.

FIG. 9 is an electric diagram of another embodiment of a variable-capacitance cell Ci of an analog-to-digital converter of the type described in relation with FIGS. 4, 5, and 6.

In the example of FIG. 9, cell Ci is formed from fixed-capacitance capacitors and from a variable-resistance element. More particularly, cell Ci comprises, between its terminals S and D, a series association of a fixed-capacitance capacitor CAP1 and of a variable-resistance resistive element RV. Capacitor CAP1 has a first electrode coupled, for example, connected, to terminal S of the cell, and a second electrode coupled, for example, connected, to a first main conduction terminal n1 of variable-resistance element RV. Element RV further has a second main conduction terminal n2 coupled, for example, connected, to terminal D of the cell.

Element RV comprises at least one control terminal g, electrically insulated from its conduction terminals n1 and n2, capable of receiving a control signal to vary resistance Rn1n2 between its terminals n1 and n2 between a low value Rn1n2L and a high value Rn1n2H. The control terminal g of element RV is coupled, for example, connected, to the control terminal G of cell Ci.

Element RV is for example a transistor, for example, a MOS transistor, terminals n1 and n2 then corresponding to the conduction terminals of the transistor (for example, the source and the drain in the case of a MOS transistor) and terminal g corresponding to a control terminal of the transistor (the gate in the case of a MOS transistor). In this case, the control signal applied to terminal g of element RV is referenced to terminal n1 or n2 of element RV. Preferably, element RV is a MOS transistor having a low threshold voltage, for example, having a threshold voltage smaller than 0.1 V, or even a zero threshold voltage.

As a variant, element RV may comprise a second control terminal (not shown) also called reference control terminal, electrically insulated from control terminal g and from main control terminals n1 and n2, the control signal applied to terminal g being referenced to the reference control terminal. An embodiment of such an element is for example an electromechanical relay with four terminals (two main conduction terminals and two control terminals electrically insulated from each other and from the two main conduction terminals).

In the example of FIG. 9, the variable-resistance element RV is an element having a negative resistance variation, that is, the resistance Rn1n2 between its main terminals n1 and n2 is a decreasing function of the voltage applied on its control terminal g.

In the example of FIG. 9, a capacitor CAP2 has been shown, in parallel with the series association of capacitor CAP1 and of resistive element RV. In practice, capacitance CAP2, rather than comprising a component specifically formed and connected between terminals S and D, may correspond to the sum of the stray capacitances of the different elements connected between terminals S and D. Further, in the present example, a capacitor CL, connected between terminal D and node GND, has further been shown. In practice, output capacitance CL, rather than comprising a component specifically formed and connected between terminal D and node GND, may correspond to the sum of the stray capacitances of the different elements coupled between terminal D and node GND.

The capacitance of capacitor CAP2 is smaller than the capacitance of capacitor CAP1. Preferably, the capacitance of capacitor CAP2 is low as compared with capacitance CL, and the capacitance of capacitor CAP1 is high as compared with capacitance CL. As an example, the capacitance of capacitor CAP2 is at least ten times smaller than capacitance CL and the capacitance of capacitor CAP1 is at least ten times greater than capacitance CL. Preferably, product Rn1n2H×CAP1 is much greater, for example, at least ten times greater, than the period of power supply voltage Φ and product Rn1n2L×CAP1 is much smaller, for example, at least ten times smaller, than the period of power supply voltage Φ.

In the example of FIG. 9, the voltage threshold VTHi of cell Ci corresponds to a switching voltage threshold of resistance Rn1n2 of variable-resistance element RV between its low value Rn1n2L and its high value Rn1n2H. When the voltage applied on the control terminal G of the cell is smaller than threshold VTHi, the resistance of element RV is at its high value Rn1n2H (for example corresponding, in the case of a transistor, to the off-state resistance of the transistor). The equivalent capacitance of cell Ci between its terminals S and D is then relatively low, for example, substantially equal to the capacitance of capacitor CAP2 alone, corresponding to the low value CSDL of the capacitance CSD of cell Ci. When the voltage applied to the control terminal G of the cell is greater than threshold VTHi, the resistance of element RV is at its low value Rn1n2L (for example corresponding, in the case of a transistor, to the on-state resistance of the transistor). The equivalent capacitance of cell Ci between its terminals S and D is then relatively low, for example, substantially equal to the capacitance of capacitor CAP1 alone (considering the capacitance of capacitor CAP2 as negligible as compared with the capacitance of capacitor CAP1), corresponding to the high value CSDH of the capacitance CSD of cell Ci.

Figure 10:
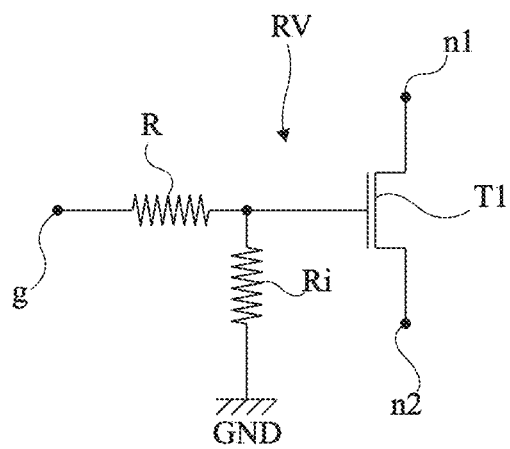
FIG. 10 is a more detailed electric diagram of an embodiment of a variable-resistance element of the variable-capacitance cell of FIG. 9.
Figure 11:
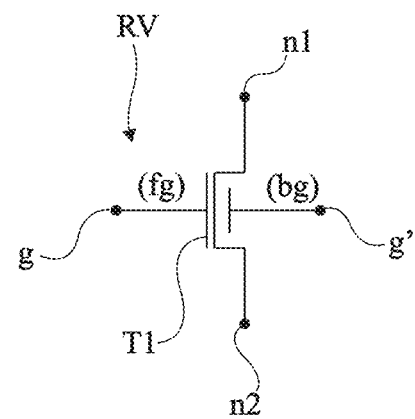
FIG. 11 is a more detailed electric diagram of another embodiment of a variable-resistance element of the variable-capacitance cell of FIG. 9.

FIGS. 10 and 11 illustrate in further detail embodiments of the variable-resistance element RV of FIG. 9, enabling to form cells Ci having different threshold voltages VTHi, to obtain an operation of the type described in relation with FIGS. 4, 5, and 6.

In the example of FIG. 10, element RV comprises a transistor T1, for example, a MOS transistor, for example, an N-channel MOS transistor. Transistor T1 has a first conduction node (source or drain in the case of a MOS transistor) coupled, for example, connected, to its terminal n1 and a second conduction node (drain or source in the case of a MOS transistor) coupled, for example, connected, to its terminal n2. Transistor T1 further has a control node (the gate in the case of a MOS transistor) coupled to terminal g of element RV via a resistive voltage dividing bridge. More particularly, in the present example, the voltage dividing bridge of element RV comprises a resistor R having a first end coupled, for example, connected, to control terminal g, and a second end coupled, for example, connected, to the control node of transistor T1. The voltage dividing bridge of element RV further comprises a resistor Ri having a first end coupled, for example connected, to node GND and a second end coupled, for example, connected, to the second end of resistor R. The division ratio of the dividing bridge formed by resistors R and Ri can thus be varied to set the switching threshold VTHi of the cell. For example, in a converter of the type described in relation with FIG. 4, the transistors T1 of the elements RV of the different cells Ci may be identical or similar, to within manufacturing dispersions, and may in particular have a same threshold voltage VTH. The resistances R of the elements RV of the different cells Ci may further be substantially identical. The resisances Ri of the different cells Ci may however be different to obtain cells Ci having different switching threshold voltages VTHi, for example, as illustrated in FIG. 5.

In the example of FIG. 11, element RV comprises a MOS transistor T1, for example, an N-channel MOS transistor. Transistor T1 has a first conduction node (source or drain) coupled, for example, connected, to its terminal n1 and a second conduction node (drain or source) coupled, for example, connected, to its terminal n2. Transistor T1 further has a first control node (its gate in the case of a MOS transistor) coupled, for example, connected, to the control terminal g of element RV.

The transistor T1 of the element RV of FIG. 11 is a dual-gate MOS transistor. Dual-gate MOS transistor here means a transistor comprising a channel-forming region laterally bordered, on the one hand, with a source region and, on the other hand, with a drain region, and further comprising a first control gate or front gate (fg), arranged above the channel-forming region and insulated from the channel-forming region by a dielectric layer, and a second control gate or back gate (bg), arranged under the channel-forming region. In such a transistor, the current flowing between the drain and the source of the transistor is a function not only of the potential applied to the front gate of the transistor, but also of the potential applied to the back gate thereof. In particular, the threshold voltage of the transistor, that is, the minimum voltage to be applied between the front gate and the source of the transistor to turn on the transistor, depends on the potential applied to the back gate of the transistor. Transistor T1 is for example a SOI-type ("semiconductor on insulator") transistor, the back gate being then insulated from the channel-forming region by a dielectric layer. Preferably, transistor T1 is a FDSOI-type ("Fully Depleted Semiconductor On Insulator") transistor, that is, a SOI transistor where the channel-forming region is fully depleted when the transistor is not biased. Indeed, in a FDSOI transistor, the variations of the control potential applied to the back gate of the transistor cause significant variations of the transistor threshold voltage, which is particularly adapted to the implementation of the embodiments which will be described, as will more clearly appear from the following description. The described embodiments are however not limited to the case where transistor T1 is of SOI or FDSOI type. More generally, the described embodiments apply to any type of MOS transistors with two control gates respectively arranged on the front side and on the back side of the channel-forming region of the transistor. As an example, the described embodiments are compatible with "bulk"-type MOS transistors, comprising a semiconductor bulk region arranged under the channel-forming region, having its upper surface in contact with the lower surface of the channel-forming region. In this case, the back gate is formed by the transistor bulk region and is not insulated from the channel-forming region. As a variation, transistor T1 may be a FinFET-type transistor.

In this example, the front gate (fg) of transistor T1 is coupled, for example, connected, to the control terminal g of element RV, the back gate (bg) of transistor T1 being coupled, for example, connected, to an additional control terminal g' of element RV. The control voltage applied to the additional control terminal g' may then be varied to set the threshold voltage of transistor T1, and thus the switching threshold VTHi of the capacitive cell. For example, in a converter of the type described in relation with FIG. 4, the transistors T1 of the elements RV of the different cells Ci may be identical or similar, to within manufacturing dispersions. The additional control terminals g' of the transistors T1 of the elements RV of the different cells Ci may however be coupled to terminals of application of different bias voltages, so that the transistors T1 of the different cells Ci have different threshold voltages, defining different switching thresholds VTHi, for example, as illustrated in FIG. 5.

It should be noted that the embodiments of FIGS. 10 and 11 may be combined. In other words, the threshold voltages VTHi of the elements RV of the different cells Ci may be defined by varying both the back gate bias voltage of transistor T1 and a resistance value of a voltage dividing bridge coupled to the front gate of transistor T1.

Figure 12:
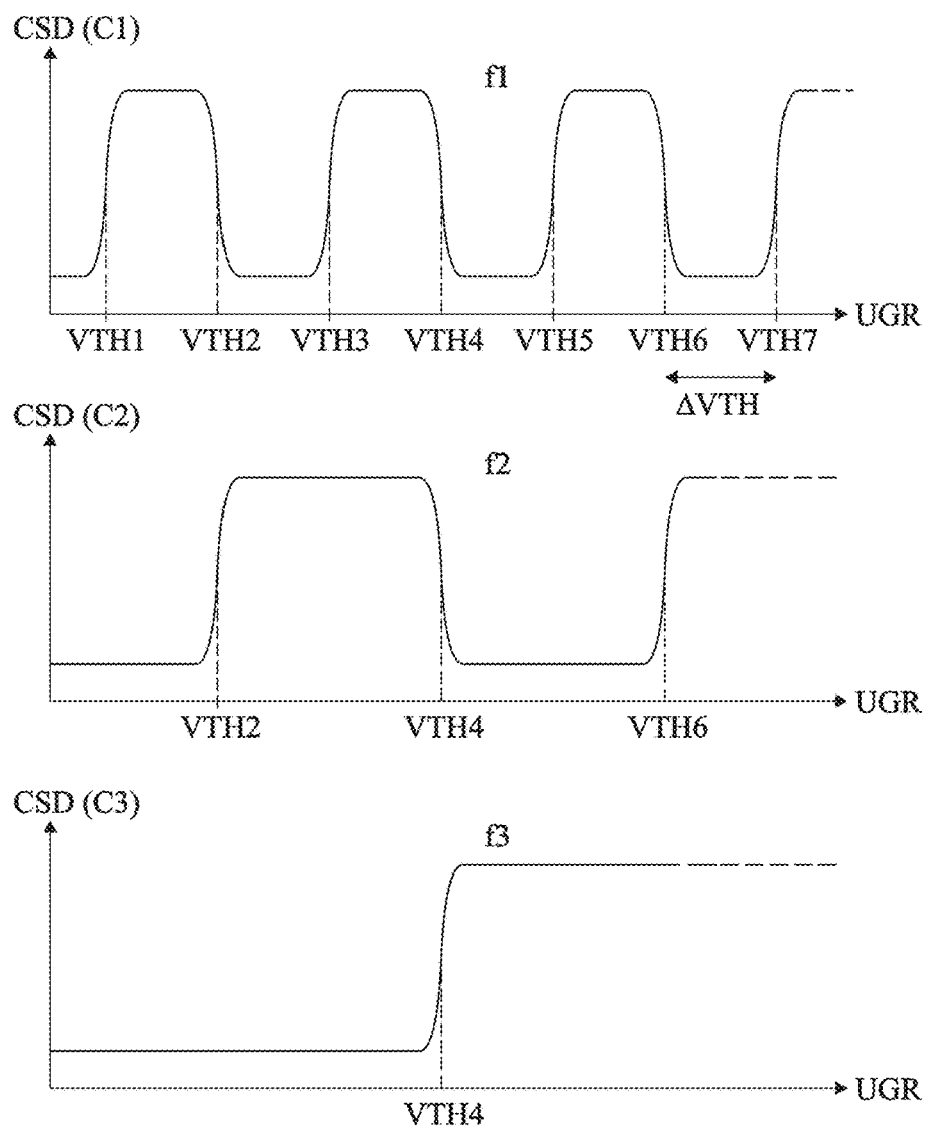
FIG. 12 is a diagram illustrating a second example of operation of the analog-to-digital converter of FIG. 4.

FIG. 12 is a diagram illustrating a second example of operation of the analog-to-digital converter of FIG. 4, enabling to obtain a natural binary coding of analog input signal Vana. For simplification, a converter with N=3 bits is considered herein, it being understood that the described examples may be adapted whatever the number N of bits of the converter.

FIG. 12 shows, for each of the capacitive cells C1, C2, and C3 of the converter, the variation of the capacitance CSD of the cell according to the voltage UGR applied between its control electrodes G and R.

As shown in FIG. 12, the transfer functions f1, f2, and f3 of cells C1, C2, and C3 have the shape of squares in a voltage range UGR corresponding to the input dynamic range of the converter, that is, the range in which the analog input voltage Vana of the converter in normal operation is capable of varying.

In the shown example, the transfer function f1 of the cell C1 delivering the least significant bit comprises four rising edges and three falling edges, that is, seven transitions between the high and low values CSDH and CSDL of its capacitance CSD. More particularly, cell C1 has a first threshold VTH1 for the switching from the low value CSDL to the high value CSDH of its capacitance CSD, a second threshold VTH2, greater than VTH1, for the switching from the high value CSDH to the low value CSDL of its capacitance CSD, a third threshold VTH3, greater than VTH2, for the switching from the low value CSDL to the high value CSDH of its capacitance CSD, a fourth threshold VTH4, greater than VTH3, for the switching from the high value CSDH to the low value CSDL of its capacitance CSD, a fifth threshold VTH5, greater than VTH4, for the switching from the low value CSDL to the high value CSDH of its capacitance CSD, a sixth threshold VTH6, greater than VTH5, for the switching from the high value CSDH to the low value CSDL of its capacitance CSD, and a seventh threshold VTH7, greater than VTH6, for the switching from the low value CSDL to the high value CSDH of its capacitance CSD.

Further, in the present example, the transfer function f2 of cell C2 delivering the intermediate significant bit comprises two rising edges and one falling edge, that is, three transitions between the high and low values CSDH and CSDL of its capacitance CSD. More particularly, cell C2 has a first threshold for the switching from the low value CSDL to the high value CSDH of its capacitance CSD, substantially equal to threshold VTH2 of cell C1, a second threshold for the switching from the high value CSDH to the low value CSDL of its capacitance CSD, substantially equal to threshold VTH4 of cell C1, and a third threshold for the switching from the low value CSDL to the high value CSDH of its capacitance CSD, substantially equal to the threshold VTH6 of cell C1.

Further, in the present example, the transfer function f3 of cell C3 delivering the most significant bit comprises a single rising edge, that is, a single transition between the low value CSDL and the high value CSDH of its capacitance CSD. More particularly, cell C3 has a threshold for the switching from the low value CSDL to the high value CSDH of its capacitance CSD substantially equal to threshold VTH4 of cell C1.

In the present example, cells C1, C2, C3 all have substantially the same low capacitance value CSDL and the same high capacitance value CSDH.

In the example of FIG. 12, the interval between two consecutive thresholds among thresholds VTH1, VTH2, VTH3, VTH4, VTH5, VTH6, VTH7 is substantially constant. In other words, for any index k in the range from 2 t 7, interval VTHk-VTHk−1 is substantially equal to a same value ΔVTH.

As in the example described in relation with FIGS. 5 and 6, the output voltage Ai on each output terminal outi of the converter depends on the ratio of the variable capacitance CSD of cell Ci, controlled by input voltage Vana, to an output stray capacitance (not detailed in FIG. 4) formed between the output terminal outi of the converter and node GND, which may be considered as a fixed capacitance, for example corresponding to the equivalent capacitance of logic cell Bi.

When the analog input voltage Vana is smaller than threshold VHT1, the capacitances CSD of cells C1, C2, and C3 are both at their low value CSDL, so that the voltage pulses A1, A2, and A3 transmitted on output terminals out1, out2, and out3 of the converter all three have a low amplitude level, corresponding to logic 0s of the input signal of circuit 120.

When analog input voltage Vana crosses threshold VTH1, the capacitance CSD of cell C1 switches to its high value CSDH, while the capacitances CSD of cells C2 and C3 remain at low value CSDL. The voltage pulses A1 and A2 transmitted on output terminals out1, out2, and out3 of the converter are thus respectively at a high level, at a low level, and at a high level, respectively corresponding to a logic 1, to a logic 0, and to a logic 0 of the input signals of circuit 120.

When analog input voltage Vana crosses threshold VTH2, the capacitance CSD of cell C1 switches to its low value CSDL, the capacitance CSD of cell C2 switches to its high value CSDH, and the capacitance CSD of cell C3 remains at low value CSDL. The voltage pulses A1, A2, and A3 transmitted on output terminals out1, out2, and out3 of the converter are thus respectively at a low level, at a high level, and at a high level, respectively corresponding to a logic 0, to a logic 1, and to a logic 0 of the input signals of circuit 120.

When analog input voltage Vana crosses threshold VTH3, the capacitance CSD of cell C1 switches to its high value CSDH, the capacitance CSD of cell C2 remains at its high value CSDH, and the capacitance CSD of cell C3 remains at low value CSDL. The voltage pulses A1, A2, and A3 transmitted on output terminals out1, out2, and out3 of the converter are thus respectively at a high level, at a high level, and at a low level, respectively corresponding to a logic 1, to a logic 1, and to a logic 0 of the input signals of circuit 120.

When analog input voltage Vana crosses threshold VTH4, the capacitance CSD of cell C1 switches to its low value CSDL, the capacitance CSD of cell C2 switches to its low value CSDL, and the capacitance CSD of cell C3 switches to its high value CSDL. The voltage pulses A1, A2, and A3 transmitted on output terminals out1, out2, and out3 of the converter are thus respectively at a low level, at a low level, and at a high level, respectively corresponding to a logic 0, to a logic 0, and to a logic 1 of the input signals of circuit 120.

When analog input voltage Vana crosses threshold VTH5, the capacitance CSD of cell C1 switches to its high value CSDH, the capacitance CSD of cell C2 remains at its low value CSDL, and the capacitance CSD of cell C3 remains at high value CSDH. The voltage pulses A1, A2, and A3 transmitted on output terminals out1, out2, and out3 of the converter are thus respectively at a high level, at a low level, and at a high level, respectively corresponding to a logic 1, to a logic 0, and to a logic 1 of the input signals of circuit 120.

When analog input voltage Vana crosses threshold VTH6, the capacitance CSD of cell C1 switches to its low value CSDL, the capacitance CSD of cell C2 switches to its high value CSDH, and the capacitance CSD of cell C3 remains at high value CSDH. The voltage pulses A1, A2, and A3 transmitted on output terminals out1, out2, and out3 of the converter are thus respectively at a low level, at a high level, and at a high level, respectively corresponding to a logic 0, to a logic 1, and to a logic 1 of the input signals of circuit 120.

When analog input voltage Vana crosses threshold VTH7, the capacitance CSD of cell C1 switches to its high value CSDH, the capacitance CSD of cell C2 remains at its high value CSDH, and the capacitance CSD of cell C3 remains at high value CSDH. The voltage pulses A1, A2, and A3 transmitted on output terminals out1, out2, and out3 of the converter all are at a high level, corresponding to logic is of the input signals of circuit 120.

The converter then performs a natural binary coding of analog input signal Vana.

Figure 13:
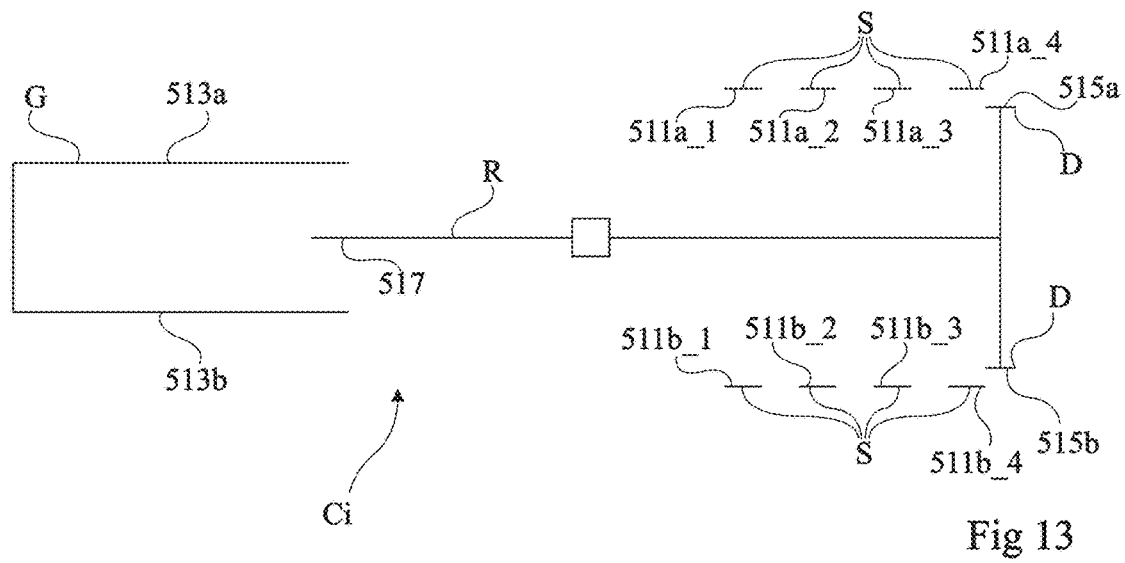
FIG. 13 is a simplified cross-section view of another embodiment of a variable-capacitance cell of the analog-to-digital converter of FIG. 4.

FIG. 13 is a simplified cross-section view of an embodiment of a variable-capacitance cell Ci enabling to obtain a square transfer function, such as described in relation with FIG. 12. The cell Ci shown in FIG. 13 enables to obtain a transfer function similar to the transfer function f1 of FIG. 12.

The cell Ci of FIG. 13 is formed of a variable-capacitance capacitor with four electromechanically controlled electrodes.

As in the example of FIGS. 7 and 8, the capacitor Ci of FIG. 13 comprises two assemblies mobile with respect to each other, respectively called hereafter fixed assembly and mobile assembly, electrodes S and G forming part of the fixed assembly and electrodes D and R forming part of the mobile assembly.

Electrode S comprises four substantially horizontal conductive plates 511*a*_1, 511*a*_2, 511*a*_3, and 511*a*_4, and four conductive plates 511*b*_1, 511*b*_2, 511*b*_3, and 511*b*_4 substantially parallel to plates 511*a*_1, 511*a*_2, 511*a*_3, and 511*a*_4 and respectively opposite plates 511*a*_1, 511*a*_2, 511*a*_3, and 511*a*_4. Plates 511*a*_1, 511*a*_2, 511*a*_3, 511*a*_4, 511*b*_1, 511*b*_2, 511*b*_3, and 511*b*_4 are electrically connected to one another.

Electrode G comprises, as in the example of FIGS. 7 and 8, two substantially horizontal conductive plates 513*a* and 513*b* facing each other, electrically connected to each other. Electrode D comprises two substantially horizontal conductive plates 515*a* and 515*b*, electrically connected to each other. Electrode R comprises a conductive plate 517.

In this example, conductive plates 511*a*_1, 511*a*_2, 511*a*_3, and 511*a*_4 on the one hand, and conductive plates 511*b*_1, 511*b*_2, 511*b*_3, and 511*b*_4 on the other hand, are substantially coplanar. The fixed assembly and the mobile assembly are arranged so that conductive plates 515*a*, 515*b*, and 517 of the mobile assembly are respectively arranged:

in a horizontal plane located between the horizontal plane of plates 511*a*_1, 511*a*_2, 511*a*_3, and 511*a*_4 and the horizontal plane of plates 511*b*_1, 511*b*_2, 511*b*_3, and 511*b*_4, closer to the plane of plates 511*a*_1, 511*a*_2, 511*a*_3, and 511*a*_4 than to the plane of plates 511*b*_1, 511*b*_2, 511*b*_3, and 511*b*_4;

in a horizontal plane located between the horizontal plane of plates 511*a*_1, 511*a*_2, 511*a*_3, and 511*a*_4 and the horizontal plane of plates 511*b*_1, 511*b*_2, 511*b*_3, and 511*b*_4, closer to the plane of plates 511*b*_1, 511*b*_2, 511*b*_3 and 511*b*_4 than to the plane of plates 511*a*_1, 511*a*_2, 511*a*_3 et 511*a*_4; and in a horizontal plane located between the horizontal plane of conductive plate 513*a* and the horizontal plane of conductive plate 513*b*, for example at an equal distance from the plane of conductive plate 513*a* and from the plane of conductive plate 513*b*.

In the example of FIG. 13, conductive plate 517 is at least partially arranged opposite conductive plates 513*a* and 513*b*.

In this example, the mobile assembly is free to displace according to a single degree of liberty in horizontal translation (parallel to conductive plates 511*a*_1, 511*a*_2, 511*a*_3, 511*a*_4, 511*b*_1, 511*b*_2, 511*b*_3, 511*b*_4, 513*a*, 513*b*, 515*a*, 515*b*, 517) with respect to the fixed assembly, to modify the surface area of mobile conductive plate 517 opposite plates 513*a* and 513*b*, and the surface area of conductive plates 515*a* and 515*b* opposite plates 511*a*_1, 511*a*_2, 511*a*_3, 511*a*_4, 511*b*_1, 511*b*_2, 511*b*_3, 511*b*_4.

More particularly, in the example of FIG. 13, when the mobile assembly displaces leftwards under the effect of an electrostatic force exerted by the conductive plates 513*a* and 513*b* of electrode G on the conductive plate 517 of electrode R, the conductive plates 515*a* and 515*b* of electrode D successively pass:

opposite the conductive plates 511*a*_4 and 511*b*_4 of electrode S, corresponding, in the example of FIG. 12, to the first rising edge of the transfer function f1 of cell C1;

opposite the free space between conductive plates 511*a*_4 and 511*a*_3 and between the conductive plates 511*b*_4 and 511*b*_3 of electrode S, corresponding, in the example of FIG. 12, to the first rising edge of the transfer function f1 of cell C1;

opposite the conductive plates 511*a*_3 and 511*b*_3 of electrode S, corresponding, in the example of FIG. 12, to the second rising edge of the transfer function f1 of cell C1;

opposite the free space between conductive plates 511*a*_3 and 511*a*_2 and between the conductive plates 511*b*_3 and 511*b*_2 of electrode S, corresponding, in the example of FIG. 12, to the second rising edge of the transfer function f1 of cell C1;

opposite the conductive plates 511*a*_2 and 511*b*_2 of electrode S, corresponding, in the example of FIG. 12, to the third rising edge of the transfer function f1 of cell C1;

opposite the free space between conductive plates 511*a*_2 and 511*a*_1 and between the conductive plates 511*b*_2 and 511*b*_1 of electrode S, corresponding, in the example of FIG. 12, to the third rising edge of the transfer function f1 of cell C1; and opposite the conductive plates 511*a*_1 and 511*b*_1 of electrode S, corresponding, in the example of FIG. 12, to the fourth rising edge of the transfer function f1 of cell C1.

Although this is not shown in FIG. 12, the width of conductive plates 515*a* and 515*b* may be smaller or greater than the width of conductive plates 511*a*_1, 511*a*_2, 511*a*_3, 511*a*_4, 511*b*_1, 511*b*_2, 511*b*_3, 511*b*_4, to obtain an overlap or non-overlap distance enabling to obtain a square shape of the transfer function and setting the switching thresholds. It will be within the abilities of those skilled in the art to obtain the desired shapes of the square transfer functions by varying the number of conductive plates forming electrode S and the dimensions and the spacing between the conductive plates forming electrode S.

Embodiments of analog-to-digital converters with a parallel architecture have been described hereabove. As a variant, an analog-to-digital converter with a series architecture, that is, capable of supplying the N binary signals A1, ... AN successively, on a same output terminal out of the converter, may be provided.

Figure 14:
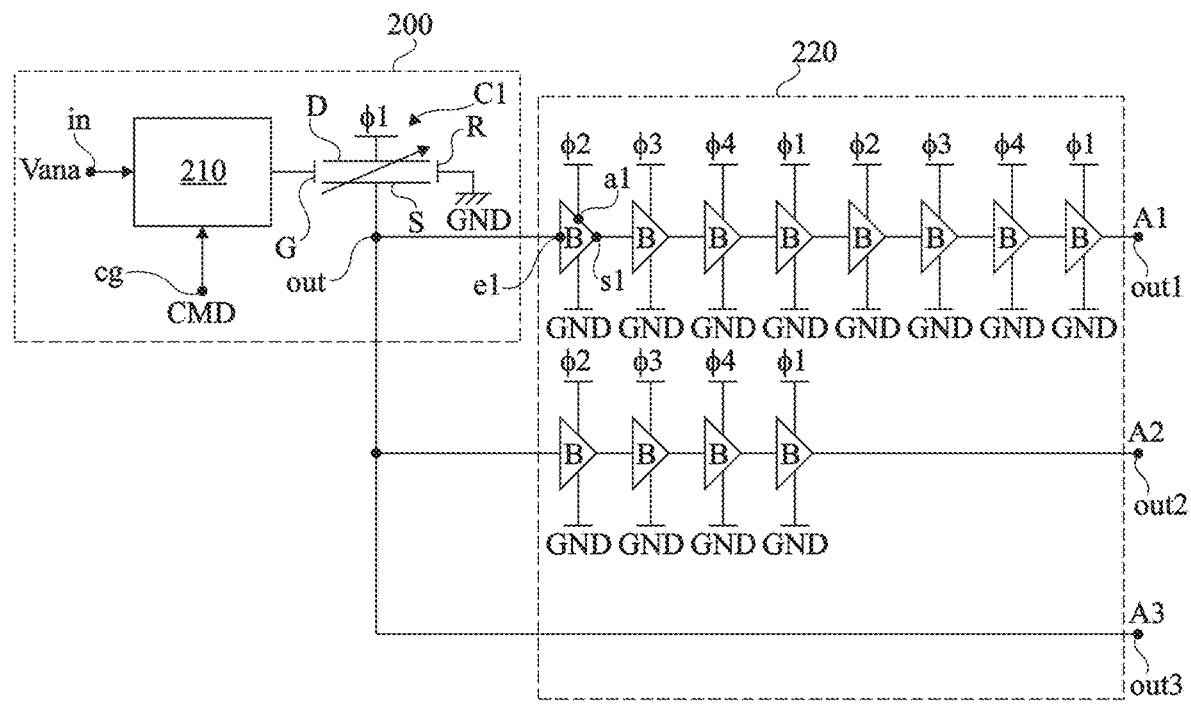
FIG. 14 is a simplified electric diagram of another example of an analog-to-digital converter according to an embodiment.

FIG. 14 schematically shows an example of an analog-to-digital converter 200 with a series architecture.

The converter 200 of FIG. 14 comprises a single variable-capacitance cell C1, for example, of the type described in relation with FIG. 1. Cell C1 may be implemented by means of a variable-capacitance capacitor comprising four electrodes, or by means of fixed-capacitance capacitors and of a variable-resistance element, similarly to what has been described hereabove.

Cell C1 has its control electrode G coupled to the input terminal in of the converter via a variable-gain circuit 210. Cell C1 further has its electrode D coupled, for example, connected, to a node of application of a variable periodic power supply voltage Φ1 of the converter, for example, a trapezoidal voltage of the above-described type. Cell C1 further has its electrode R coupled, for example, connected, to a node GND of application of a reference potential of the converter, for example, grounded. Cell C1 has its electrode S coupled, for example, connected, to the output terminal out of the converter.

Cell C1 for example comprises single threshold VTH for the switching between the high and low values of its capacitance CSD. Variable-gain circuit 210 is capable of receiving a gain control signal CMD on a gain control port cg. The voltage applied to the electrode G of cell C1 by circuit 210 corresponds to input voltage Vana multiplied/divided by the variable gain of circuit 210. As an example, circuit 210 is a voltage divider having its division ration settable via signal CMD.

A phase of conversion of analog input signal Vana into a digital signal can be broken down into N elementary conversion phases. The duration of each elementary conversion phase for example corresponds to a period of power supply voltage Φ1. Between two elementary conversion phases (for example, here, during phase P4 of power supply voltage Φ1), the gain of circuit 210 is modified, via control signal CMD. At the end of each elementary conversion phase, the converter supplies on its output node out a binary logic signal corresponding to one of the bits of the digital output word of the converter.

Thus, as compared with the previously-described parallel architectures, the sampling frequency is divided by the number N of output bits of the converter.

In FIG. 14, in addition to converter 200, a parallelization circuit 220 connected to the output terminal out of the converter has been shown. Circuit 220 comprises N delay lines coupling the output terminal out of the converter to respectively N terminals out1, ... outN. For simplification, a converter with N=3 output bits has been considered herein. It will be within the abilities of those skilled in the art to adapt the described example whatever the number N of output bits of the converter.

Circuit 220 enables to delay the output bits successively delivered by the converter, to be able to deliver in parallel (on the same phase of the power supply voltage, here Φ2), for example, on delivery of the last bit by the converter, the N output bits of the converter over a parallel bus formed by terminals out1, ... out N.

In the shown example:
the terminal out of converter 200 is directly connected to terminal out3 of parallelization circuit 220;
the terminal out of converter 200 is coupled to terminal out2 of parallelization circuit 220 via a series association of four buffer cells B, for example, of the type described in relation with FIG. 2, respectively powered, starting from the cell closest to converter 200, with power supply voltages Φ2, Φ3, Φ4, and Φ1; and
the terminal out of converter 200 is coupled to terminal out1 of parallelization circuit 220 via a series association of eight buffer cells B, for example, of the type described in relation with FIG. 2, respectively powered, starting from the cell closest to converter 200, with power supply voltages Φ2, Φ3, Φ4, Φ1, Φ2, Φ3, Φ4, and Φ1.

Thus, the signal delivered on terminal out3 of circuit 220 directly is the converter output signal, the signal delivered on terminal out2 of circuit 220 corresponds to the output signal of the converter delayed by one period of the power supply voltage, and the signal delivered on output out1 of circuit 220 corresponds to the output signal of the converter delayed by N−1=2 periods of the power supply voltage.

Figure 15:
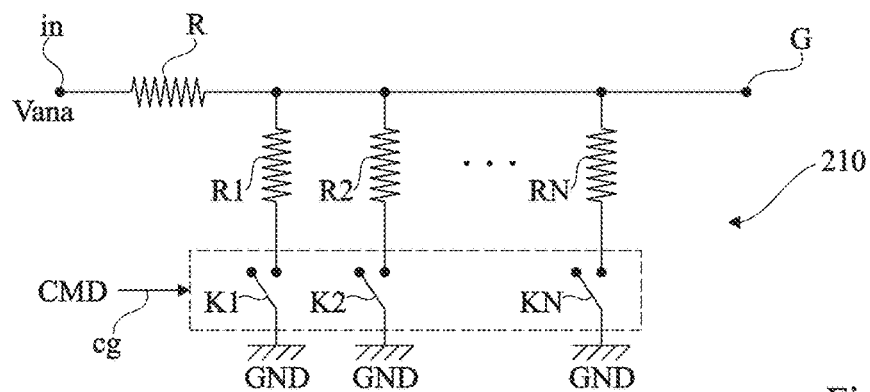
FIG. 15 is a more detailed electric diagram of an embodiment of a variable-gain circuit of the analog-to-digital converter of FIG. 14.

FIG. 15 shows an embodiment of the variable-gain circuit 210 of the converter 200 of FIG. 14.

In the present example, circuit 210 is a resistive voltage dividing bridge having a variable division ratio. More particularly, in the present example, circuit 210 comprises a resistor R having a first end coupled, for example, connected, to the input terminal in of the converter, and a second end coupled, for example connected, to the control terminal G of the variable-capacitance cell C1 of the converter. Circuit 210 further comprises, between the second end of resistor R and node GND, N parallel branches, each comprising a series association of a resistor Ri and of a switch Ki, for example, a transistor or an micro-electromechanical relay. In the shown example, each resistor Ri has a first end coupled, for example, connected, to the second end of resistor R, and a second end coupled to node GND via the switch Ki of same rank i. Resistors R1, ... RN for example respectively have N different values. Control signal CMD enables, via port cg, to individually control each of the N switches K1, ... KN. As an example during each of the N elementary conversion phases of a phase of conversion of analog input signal Vana into a digital signal, one and a single switch Ki among the N switches K1, ... KN is maintained on, the other switches being maintained off. Between two elementary conversion phases (for example, here, during phase P4 of power supply voltage Φ1), the rank i of the switch Ki controlled to the on state is modified, to modify the gain of circuit 210.

Figure 16:
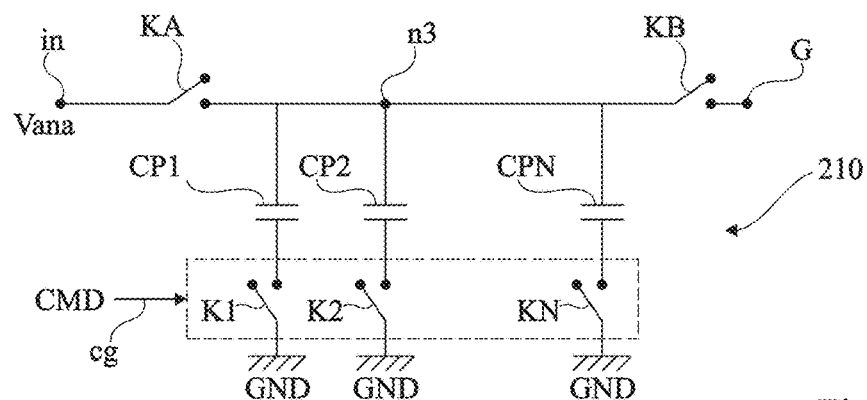
FIG. 16 is a more detailed electric diagram of another embodiment of a variable-gain circuit of the analog-to-digital converter of FIG. 14.

FIG. 16 shows another embodiment of the variable-gain circuit 210 of the converter of FIG. 14.

In the present example, circuit 210 is a variable-capacitance charge pump circuit. More particularly, in the present example, circuit 210 comprises two switches KA and KB, for example, transistors or micro-electromechanical relays, in series between the input terminal in of the converter and the control terminal G of variable-capacitance cell C1. In the present example, switch KA has a first conduction node coupled, for example, connected, to terminal in and a second conduction node coupled, preferably connected, to an intermediate node n3 of circuit 210, and switch KB has a first conduction node coupled, for example, connected, to node n3 and a second conduction node coupled, for example, connected, to terminal G.

Circuit 210 further comprises, between node n3 and node GND, N parallel branches, each comprising a series association of a capacitor Cpi and of a switch Ki, for example, a transistor or a micro-electromechanical relay. In the shown example, each capacitor CPi has a first electrode coupled, for example, connected, to node n3 and a second electrode coupled to node GND via the switch Ki of same rank i.

Capacitors CP1, ... CPN for example respectively have N different capacitance values. Control signal CMD enables, via port cg, to individually control each of the N switches K1, ... KN.

As an example during each of the N elementary conversion phases of a phase of conversion of analog input signal Vana into a digital signal, one and a single switch Ki among the N switches K1, ... KN is maintained on, the other switches being maintained off. During a first phase, for example corresponding to the first half of the elementary conversion phase, switches KA and KB are maintained respectively on and off to charge capacitor Ci. During a second phase, for example corresponding to the second half of the elementary conversion phase, switches KA and KB are maintained respectively off and on, to apply to control terminal G a voltage proportional to radio Ci*Vana. Between two elementary conversion phases, the rank i of switch Ki controlled to the on state is modified, to modify the gain of circuit 210.

Various embodiments and variants have been described. Those skilled in the art will understand that certain features of these embodiments can be combined and other variants will readily occur to those skilled in the art. In particular, the described embodiments are not limited to the specific examples of implementation of the variable-capacitance cells Ci, of the variable-resistance elements RV, and of the variable-gain circuits 210 described hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An analog-to-digital converter for an adiabatic logic circuit, comprising at least one variable-capacitance cell, said at least one cell comprising first and second main terminals and at least one control terminal insulated from its first and second main terminals and capable of receiving a control voltage to vary the capacitance between its first and second main terminals between a low value and a high value, wherein:
   said at least one cell has its first main terminal coupled to a node of application of a variable periodic converter power supply voltage;
   said at least one cell has its second main terminal coupled to a node for supplying a binary output signal of the converter; and
   said at least one cell receives on its first control terminal a voltage representative of an analog input voltage of the converter;
   wherein said at least one cell comprises a plurality of cells respectively having different threshold voltages for the switching between the low value and the high value of the capacitance between their first and second main terminals, the second main terminals of said cells being respectively coupled to different nodes for supplying binary output signals of the converter.

2. The converter according to claim 1, wherein each cell receives on its control terminal a voltage equal to the analog input voltage of the converter.

3. The converter according to claim 1, wherein each cell has a transfer function between the control voltage applied to its control terminal and the capacitance between its first and second main terminals having a single rising edge defining a cell switching threshold voltage.

4. The converter according to claim 3, wherein each cell comprises an electromechanically-controlled variable-capacitance capacitor comprising four electrodes, the capacitors of the different cells having different structures defining the different switching threshold voltages.

5. The converter according to claim 3, wherein each cell comprises at least one fixed-capacitance capacitor and one variable-resistance element, the variable-resistance elements of the different cells having different threshold voltages for the switching between a high resistance value and a low resistance value.

6. The converter according to claim 5, wherein each variable-resistance element comprises a transistor having a front gate coupled to the control terminal of the cell via a voltage-dividing bridge, the voltage-dividing bridges of the variable-resistance elements of different cells having different division ratios.

7. The converter according to claim 5, wherein each variable-resistance element comprises a dual-gate transistor comprising a front gate coupled to the control terminal of the cell and a back gate, the back gates of the transistors of the variable-resistance elements of different cells being coupled to terminals of application of different bias voltages.

8. The converter according to claim 1, wherein at least one cell among said plurality of cells has a transfer function between the control voltage applied to its control terminal and the capacitance between its first and second main terminals exhibiting at least one rising edge and one falling edge respectively defining two different cell switching threshold voltages.

9. The converter according to claim 8, wherein each cell comprises an electromechanically-controlled variable-capacitance capacitor comprising four electrodes, the capacitors of the different cells having different structures defining the different switching threshold voltages.

10. An analog-to-digital converter for an adiabatic logic circuit, comprising at least one variable-capacitance cell, said at least one cell comprising first and second main terminals and at least one control terminal insulated from its first and second main terminals and capable of receiving a control voltage to vary the capacitance between its first and second main terminals between a low value and a high value, wherein:
    said at least one cell has its first main terminal coupled to a node of application of a variable periodic converter power supply voltage;
    said at least one cell has its second main terminal coupled to a node for supplying a binary output signal of the converter; and
    said at least one cell receives on its first control terminal a voltage representative of an analog input voltage of the converter;
    wherein said at least one variable-capacitance cell comprises a single variable-capacitance cell, the converter further comprising a variable-gain circuit coupling the control terminal of said cell to a terminal of application of the analog input voltage of the converter.

11. The converter according to claim 10, wherein the variable-gain circuit comprises a resistive voltage dividing bridge having a variable division ratio.

12. The converter according to claim 10, wherein the variable-gain circuit comprises a variable-capacitance capacitive charge pump.

* * * * *